(12) United States Patent
Hanna et al.

(10) Patent No.: US 8,724,336 B2
(45) Date of Patent: May 13, 2014

(54) CARD GUIDE SYSTEM AND METHOD

(75) Inventors: John N. Hanna, Austin, TX (US); David M. Crowley, Austin, TX (US)

(73) Assignee: National Instruments Corporation, Austin, TX (US)

( * ) Notice: Subject to any disclaimer, the term of this patent is extended or adjusted under 35 U.S.C. 154(b) by 363 days.

(21) Appl. No.: 12/829,649

(22) Filed: Jul. 2, 2010

(65) Prior Publication Data

US 2012/0002385 A1    Jan. 5, 2012

(51) Int. Cl.
*H05K 7/16* (2006.01)
*H05K 5/00* (2006.01)
*H05K 7/00* (2006.01)

(52) U.S. Cl.
USPC ........... 361/756; 361/727; 361/732; 361/733; 361/752

(58) Field of Classification Search
USPC ............. 361/679.01, 679.02, 679.08, 679.09, 361/679.3, 679.55–679.59, 681, 683, 361/724–747, 751–756; 455/575.1
See application file for complete search history.

(56) References Cited

U.S. PATENT DOCUMENTS

| | | | |
|---|---|---|---|
| 4,007,403 A | 2/1977 | Fiege | |
| D253,172 S | 10/1979 | Ross | |
| 4,915,636 A | 4/1990 | Knight | |
| 5,055,061 A | 10/1991 | Lichtenwalter | |
| 5,467,254 A * | 11/1995 | Brusati et al. | 361/799 |
| 5,754,406 A | 5/1998 | Hardt et al. | |
| 5,844,775 A * | 12/1998 | Lundberg | 361/679.08 |
| 5,932,843 A | 8/1999 | Besserer et al. | |
| 6,145,943 A | 11/2000 | Reuter et al. | |
| 6,151,202 A | 11/2000 | Meuller et al. | |
| 6,269,006 B1 | 7/2001 | Treiber et al. | |
| 6,346,003 B1 | 2/2002 | Vilgiate | |
| 6,381,122 B2 | 4/2002 | Wagener | |
| 6,381,149 B1 | 4/2002 | Megason et al. | |
| 6,434,018 B1 | 8/2002 | Waltz | |
| 6,474,479 B2 | 11/2002 | Kurrer et al. | |
| 6,661,673 B2 | 12/2003 | Brooks et al. | |
| 7,022,916 B1 * | 4/2006 | Cavanaugh et al. | 174/72 A |
| 7,355,861 B2 | 4/2008 | Durney et al. | |
| 2007/0189677 A1 * | 8/2007 | Murry et al. | 385/92 |

OTHER PUBLICATIONS

"PCIMG 2.0 R3.0: Compact PCI Specification, Oct. 1, 1999 including ECN 2.0-3.0-002: Self-Describing Slot Geography. PCIMG," Jan. 23, 2002, pp. 1-118.
"IEEE Standard for Mechanical Core Specifications for Microcomputers Using IEC 60603-2 Connectors," Sep. 1998, 52 pages.
"IEEE Standard for Additional Mechanical Specifications for Microcomputers Using the IEEE Std 1101.1-1991 Equipment Practice," Dec. 1996, 38 pages.
"International Standard CEI, IEC, 297-3," Mar. 1992, 22 pages.
"Compact PCI Express PICMG EXP.0 R1.0 Specification," Jun. 27, 2005, 174 pages.

* cited by examiner

*Primary Examiner* — Jenny L Wagner
*Assistant Examiner* — Jerry Wu
(74) *Attorney, Agent, or Firm* — Meyertons Hood Kivlin Kowert & Goetzel, P.C.; Jeffrey C. Hood

(57) ABSTRACT

A cardguide to be disposed in a computer chassis during use. The cardguide includes a track to accept an edge of a printed circuit board of a modular computer device to be disposed in the computer chassis during use. The cardguide further comprises an integral clip configured to retain at least a portion of a temperature sensing device during use. The clip provides for positioning the temperature sensing device within the computer chassis during use.

20 Claims, 4 Drawing Sheets

CARD GUIDE SYSTEM AND METHOD

BACKGROUND OF THE INVENTION

1. Field of the Invention

This invention relates to card guides and more particularly to card guides used in computer chassis systems.

2. Description of the Related Art

Computer systems often include a number of devices that are connected to one another during operation. For example, a test and measurement computer system often include a chassis (e.g., a PXI chassis) having one or more modules (e.g., PXI modules) residing in one or more slots of the chassis. Modules may include central processing modules, data-acquisition modules, signal generation modules, signal conditioning modules, and the like. Various types and numbers of modules may be provided in a single chassis, thereby providing a computer system with an increased amount of operational flexibility.

During operation components located on the modules or elsewhere within a chassis may generate heat which can elevate the temperature within the chassis. In some instances, the temperature can even exceed operational limits and can cause a component to overheat, resulting in failure of the component. Often, airflow is provided through the chassis to help remove the heat and cool the chassis and the components disposed therein. In some instances, it may be beneficial to detect the temperature within the chassis to monitor a status of the chassis, regulate airflow based on the detected temperature, or to control operation of components based on the detected temperature. For example, fan speed may be increased or decreased based on a detected temperature or a component may be shut-off when the detected temperature within the chassis exceeds threshold. Unfortunately, detecting temperature measurements within a chassis may be difficult as the chassis is typically enclosed during operation, thereby preventing access to the interior of the chassis.

Accordingly, there is a desire to provide techniques for detecting temperatures within a computer system chassis.

SUMMARY

Described herein are embodiments relating to a system and method for detecting temperatures within a computer system chassis, including a technique for disposing an instrument, such as a thermistor, within a chassis. For example, in one embodiment, provided is a cardguide that includes a cardguide body to be disposed in a slot of a computer chassis during use. The slot is configured to house a modular computer device during use. A track accepts an edge of a printed circuit board of the modular computer device to be disposed in the slot of the computer chassis during use. A clip is coupled to the central member, wherein the clip retains at least a portion of a temperature sensing device during use. The clip provides for positioning the temperature sensing device proximate to the slot of the computer chassis during use.

In another embodiment, provided is a method that includes coupling a cardguide to a computer chassis. The cardguide includes a cardguide body to be disposed in a slot of the computer chassis during use, wherein the slot is to house a modular computer device during use. A track accepts an edge of a printed circuit board of the modular computer device to be disposed in the slot of the computer chassis during use. A clip is coupled to the central member, wherein the clip retains at least a portion of a temperature sensing device during use. The clip provides for positioning the temperature sensing device proximate the slot of the computer chassis during use. The method further including disposing a temperature sensing device in the clip, wherein the temperature sensing device detects an internal temperature of the computer chassis proximate to the slot of the computer chassis during use.

In yet another embodiment, provided is a cardguide to be disposed in a computer chassis during use. The cardguide includes a track to accept an edge of a printed circuit board of a modular computer device to be disposed in the computer chassis during use. The cardguide further comprises an integral clip configured to retain at least a portion of a temperature sensing device during use. The clip provides for positioning the temperature sensing device within the computer chassis during use.

BRIEF DESCRIPTION OF THE DRAWINGS

A better understanding of the present invention can be obtained when the following detailed description of the preferred embodiment is considered in conjunction with the following drawings, in which.

Figure 1:
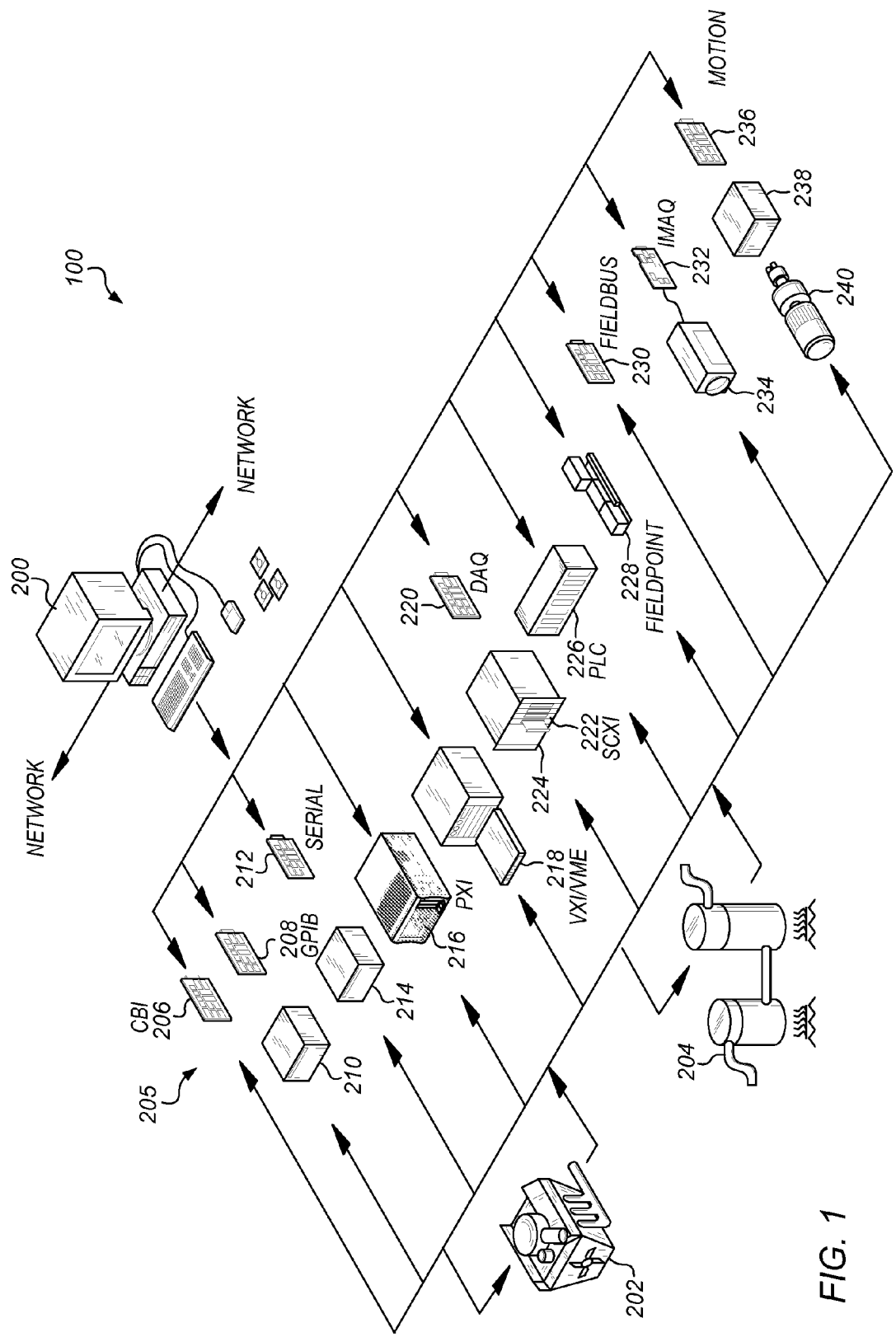
FIG. 1 is a diagram that illustrates a computer system in accordance with one or more embodiments of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of the present invention. However, one having ordinary skill in the art should recognize that the invention may be practiced without these specific details. In some instances, well-known structures, and techniques have not been shown or described in detail to avoid obscuring the present invention.

As discussed in more detail below, certain embodiments include a cardguide that is to be disposed within a computer chassis during use. In certain embodiments, the cardguide includes a cardguide of a computer chassis, such as a PXI chassis. In some embodiments, the cardguide is capable of retaining an instrument, such as a thermistor, to provide for positioning of the instrument within the computer chassis during use. In certain embodiments, the cardguide includes one or more clips for securing the instrument to the cardguide. In some embodiments, the clip retains a thermistor, or similar temperature measurement device, such that a temperature can be detected within the chassis at or near the cardguide. In certain embodiments, the clip enables an instrument to be clipped into place without the use of tools and/or without the addition of components to the cardguide. In some embodiments, the clip is formed integral with the body of the cardguide. In certain embodiments, the clip is molded as an integral portion of the cardguide. In some embodiments, one or more of the clips includes an L-shaped or C-shaped member defining a cavity for placement of the instrument. In certain embodiments, a wire of a thermistor or similar instrument may be disposed into one of more clips. Thus, during use, a thermistor or similar temperature measurement device may be secured within the one or more clips such that a temperature measurement within the chassis can be obtained without having exposed wires protruding or dangling within card slots or other internal regions of the chassis during use.

Turning now to the figures, FIG. 1 illustrates an exemplary measurement/control system ("computer system") 100 that may implement one or more embodiments of the present technique. Computer system 100 may include various combinations of hardware and software that include devices that can be used to implement various computer based processes.

In the illustrated embodiment, computer system 100 includes a host computer system 200. Host computer system 200 may be operable to execute computer programs/routines that provide various computer related functions. Host computer system 200 may include various components such as central processing unit (CPU) and a memory medium. The memory medium may include a tangible non-transitory computer readable storage medium, such as random access memory (RAM), flash memory, hard-drives, and/or CD-ROMs, or the like. The memory medium may have program instructions stored thereon that are executable (e.g., by CPU) to implement one or more computer implemented methods. In the illustrated embodiment, host computer system 200 includes a display device (e.g., a monitor), an alpha-numeric input device (e.g., a keyboard), and a directional input device (e.g., a mouse). In some embodiments, host computer system 200 may include modular and/or plug-in boards/cards (e.g., with either commercially available or proprietary hardware) that may be added via a number of expansion slots internal or external to the computer body. For example, host computer system 200 may include PCI/PCI Express slots and PCI/PCI Express cards disposed therein. As described in more detail below, host computer system 200 may be connected to one or more devices, such as an expansion chassis for connecting to a various number and combination of devices. In certain embodiments, host computer system 200 and/or other portions of computer system 100 may be connected to one or more other devices via a network, such as an internal network (e.g., a local area network (LAN)) and/or an external network (e.g., the internet). In certain embodiments, host computer system 200 may be used for various input/output (I/O) functions and processing tasks. For example, host computer system 200 may be used for data acquisition (DAQ) (e.g., when a DAQ digitizing board is installed in computer 200 or a device coupled thereto, such as a PXI chassis, and associated software is run).

Host computer system 200 may be configured to connect/communicate with other instruments/devices of computer system 100. In some embodiments, host computer system 200 may operate with the one or more devices of computer system 100 to generate and provide data, to acquire data, and/or to analyze data. For example, computer system 200 may communicatively couple to and control one or more devices 202, processes 204, or the like. Host computer system 200 may operate with the one or more devices in communication with device 202 or process 204 to perform an automation function, such as MMI (Man Machine Interface), SCADA (Supervisory Control and Data Acquisition), portable or distributed data acquisition, process control, advanced analysis, or other data acquisition and control functions. For example, computer system 100 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 100 may include a programmable hardware element, using an FPGA or a processor and memory, and/or one or more portions of user code.

Computer system 100 may include a variety of devices. For example, computer system 100 may include modular instrumentation devices 205, such test and measurement devices manufactured by National Instruments Corporation, headquartered in Austin, Tex. In some embodiments, computer system 100 may include computer based instrumentation (CBI) 206, such as a digital multi-meter (DMM), an oscilloscope (SCOPE), a radio-frequency (RF) device (e.g., up-converter or down-converter), an arbitrary waveform generator (ARB), or the like. Computer system 100 may include general purpose interface bus (GPIB) device 208, such as a modular GPIB card used to communicate with a GPIB device 210 (e.g., an oscilloscope) via a GPIB communication protocol. Computer system 100 may include a serial device 212, such as a modular serial card used to communicate with a serial device 214 (e.g., an oscilloscope) via a serial communication protocol. Computer system 100 may include a (PXI) device 216, such as a PXI chassis having PXI form factor modular devices (e.g., modules) installed therein. Computer system 100 may include a VXI/VME device 218, such as a VXI/VME chassis having VXI/VME form factor modular devices (e.g., VXI/VME controllers/modules) installed therein. Computer system 100 may include a data acquisition (DAQ) device 220, such as modular instrumentation including data input/output (I/O) interfaces for receiving, transmitting, conditioning, and/or processing signals (e.g., digital and analog signals). Computer system 100 may include signal conditioning (SCXI) devices 222 that can be used to condition and/or route signals, such as I/O signals as those transmitted/received at DAQ device 220. SCXI device 222 may include a chassis 224 having devices 222 installed therein (e.g., a relay/switch module). Computer system 100 may include a programmable logic controller (PLC) 226, such as a PLC used for the automation of electromechanical process. Computer system 100 may include a distributed I/O module, such as a fieldpoint module 228. Computer system 100 may include a distributed control module, such as a fieldbus module 230. Computer system 100 may include an image acquisition (IMAQ) system, such as a modular IMAQ module 232 and an associated IMAQ device (e.g., camera) 234. Computer system 100 may include a motion control system, such as a modular motion controller device 236, a motor drive 238, and a motor 240. Computer system 100 may include any variety of other devices. Although some of the devices are illustrated in association with a chassis (e.g., modules) and some or illustrated independent from a chassis (e.g., card or standalone devices), embodiments may include all or some of the described device being provided in a module form factor to be housed in a chassis and/or a card form factor be installed in computer 200. For example, PXI device 216 may include a PXI chassis housing any combination of PXI form factor modular CBI devices, GPIB devices, serial devices, SCXI devices, DAQ devices, IMAQ devices, motion devices, or the like. In some embodiments, similar devices may also be provided in a PCI form factor and installed in PCI slots of computer 200.

Figure 2:
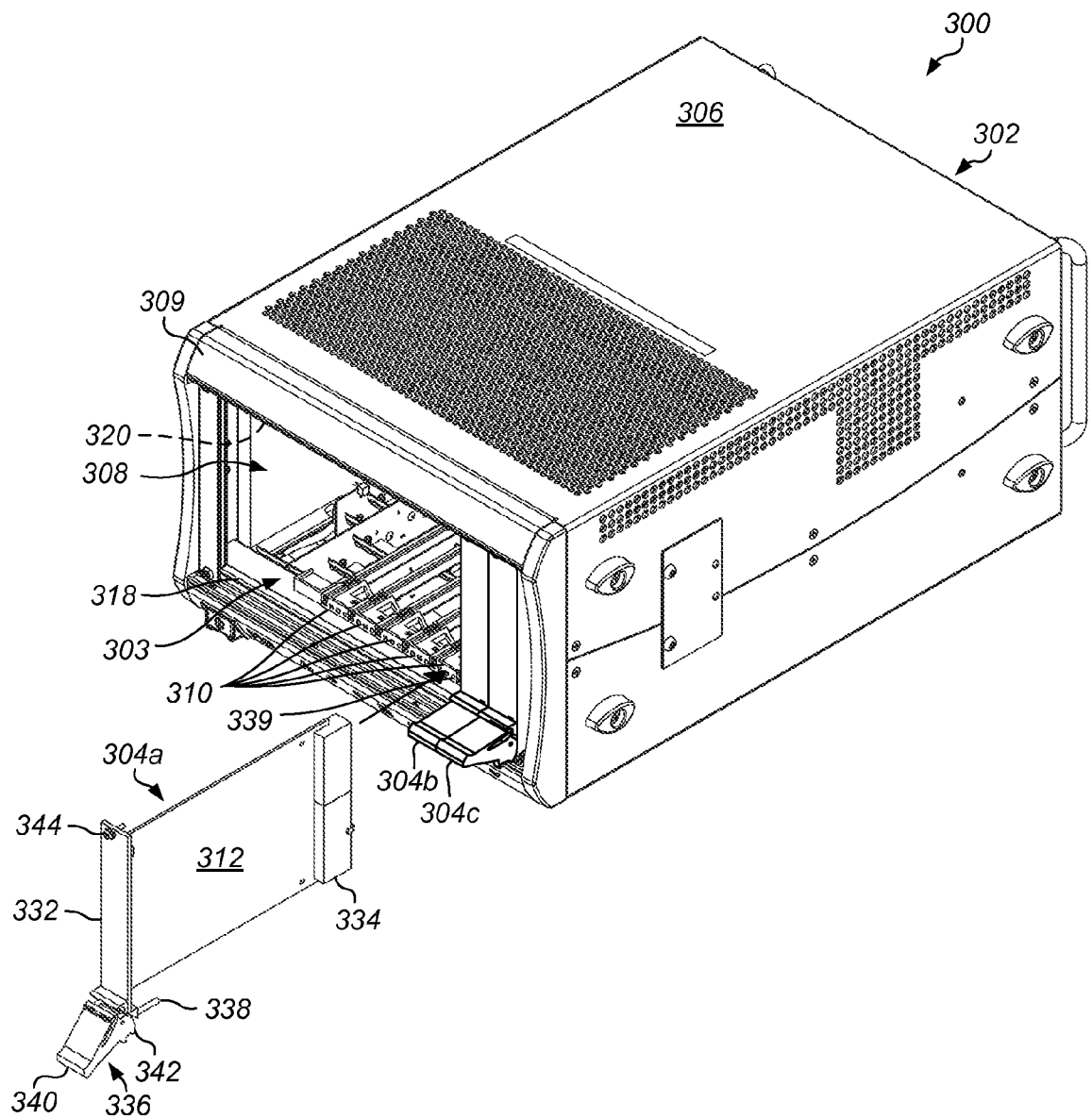
FIG. 2 is a diagram that illustrates a chassis system in accordance with or more embodiments of the present technique.

FIG. 2 illustrates a chassis system 300 in accordance with in accordance with or more embodiments of the present technique. In some embodiments, chassis system 300 includes a computer chassis for housing one or more modular computer devices, such as a PXI chassis or a VXI/VME chassis for housing PXI and VXI/VME devices, respectively, such as those described above. For example, in the illustrated embodiment, chassis system 300 includes an eight-slot PXI chassis 302 having seven slots 303 for housing peripheral modular computer devices and one slot (to the far left of the illustrated chassis 302) for housing a controller device. In the illustrated embodiment, chassis system 300 includes two modular computer devices 304b and 304c installed two slots 303 of chassis 302 and a third modular device 304a that is not installed within a slot 303 of chassis 302. Modules 304a, 304b and 304c may be collectively referred to herein as modules 304.

Each of modules 304 may include various computing devices, such as central processing modules, data-acquisition modules, signal generation modules, signal conditioning modules, or the like. For example, modules 304a may include a modular CBI devices, a GPIB device, a serial device, an SCXI device, a DAQ device, an IMAQ device, a motion control device, or the like. Various types and numbers of modules may be provided in single chassis. The ability to mix-and-match various types of modules may facilitate providing a computer system with increased amount of operational flexibility. In some embodiments, a plurality of chassis may be interconnected to provide additional flexibility in configuring a computer system. For example, two eight slot chassis, such as chassis 302 and another chassis, may be interconnected to provide a single system capable of coordinating operation of sixteen modules.

Other embodiments may include any number of slots and slot configurations. In some embodiments, modules 304 may include "3U" PXI modular devices. Although several of the embodiments depicted and described herein relate to a PXI chassis system, the techniques described herein may apply to various chassis systems, such as VXI/VME chassis systems. Moreover, the techniques described herein may be applicable to cardguides of similar modular computer systems.

In some embodiments, chassis 302 includes an enclosure 306. Enclosure 306 may include a rigid housing formed of metal, such as one or more sheet of aluminum or steel. As depicted, slots 303 may extend internally into enclosure 306. For example, slots 303 may each extend from an opening 308 at a front end of enclosure 1306 toward a rear portion of enclosure 306. In some embodiments, opening 308 is surrounded by a bezel 309 that extends about the top, bottom and/or sides of opening 308. A rear portion of chassis 302 and enclosure 306 may include a backplane that facilitates communication with modules 304. Thus, a front end of chassis 302 may be defined as an end of chassis 302 where modules are inserted and removed from and/or where a substantial amount of user accessible input/output (I/O) and/or user interfaces are located during use. A rear end of chassis 302 may be defined as an end of chassis 302 opposite from the front end and/or including a backplane connector that is complementary to connectors of one or more modular devices 304.

In some embodiments, chassis 302 may include cardguides 310 that guide insertion and/or removal of modules 304 into/from slots 303 of chassis. Cardguides 310 may be coupled to one or more portions of chassis 302, such as enclosure 306. In some embodiments, each of cardguides 310 may include an elongated slot/track that facilitates installation and retention of modules 304 within a respective one of slots 303. During use, the slot may be engaged by a complementary edge of a printed circuit board (PCB) of a module 304. For example, an edge of a PCB 312 of module 304a may engage a slot/track of a cardguide 310 to guide insertion of modules 304a into a slot 303.

In some embodiments, chassis 302 may include one or more rails proximate a front end of chassis 302 that can be used to secure one or more modular computer devices to chassis 302. In the illustrated embodiment, for example, chassis 302 includes a lower front rail 318 and an upper front rail 320 that run along the lower edge and upper edge, respectively, of opening 308. The lower front rail 318 and the upper front rail 320 may facilitate installation and securing of modules 304 to chassis 302, as described in more detail below.

Modules 304 may include various physical features that facilitate installation and operation of the module within chassis 302. For example, in the illustrated embodiment, module 304a includes PCB 312, a front panel 332, a rear connector 334, and a latching mechanism 336. PCB 330 may provide for mechanical support and electrically coupling electronic components (e.g., integrated circuits) using conductive pathways, tracks or traces etched from copper sheets laminated onto a non-conductive substrate, for example. As described above, upper and lower edges of PCB 312 may engage a complementary upper and lower cardguide 310 of a slot 303 to facilitate insertion, removal and retention of module 304a. In some embodiments, front panel 332 may provide for enclosing at least a respective portion of opening 308 when module 304a is installed in chassis 302. In some embodiments, for example, front panel 332 may include a substantially flat and rigid (e.g., metal) plate that extends from lower front rail 318 to upper front rail 320 when installed in chassis 302. In some embodiments, front panel 332 may provide a location for I/O interfaces (e.g., electrical connectors/plugs) of module 304a. For example, front panel 332 may include one or more I/O connectors that enable communication/data cables to be connected to module 304a via front panel 332. In some embodiments, rear connector 334 may interface with (e.g., plug into) a complementary backplane connector of chassis 302 when module 304a is installed into chassis 302. Rear connector 334 may provide for the communication/transmission of signals with other portions of computer system 100.

In some embodiments, modules 304 may be physically installed into chassis 302 by sliding each of modules 304 into upper and/or lower cardguides 310 of one or more slots 303 of chassis 302. For example, single slot modules 304a, 304b or 304c may be slid into upper and lower cardguides 310 of a single slot 306 of chassis 302. A wider module (e.g., a two slot module) may be slid into two or more adjacent cardguides 310 and slots 303 of chassis 302. Conversely, modules 304 may be physically uninstalled from chassis 302 by sliding each respective module 304 out of one or more cardguides 310 and slots 303 of chassis 302.

In some embodiments, a module may mechanically couple to chassis 302 to inhibit the module from unintentionally sliding out of its respective cardguide and slot. For example, module 304a includes a fastening device 336 that may secure module 304a into a slot 303 of chassis 302 during use. In some embodiments, fastening device 336 engages lower front rail 318 and may be actuated during installation to facilitate fully seating module 304a into one of slots 303. For example, where module 304a is advanced into a cardguide 310 and a slot 303 such that a guiding pin 338 of fastener 336 aligns with and engages a complementary aligning hole 339 of a cardguide 310, a full seating of module 304a may be accomplished by actuating fastening device 336 to draw module 304a into the fully seated/installed position. For example, fastening device 336 may include a lever 340 that is moved upward to cause fingers 342 to engage lower front rail 318 of chassis 302. As lever 340 is advanced upward, fingers 342 engage a rear edge/lip of lower front rail 318 to pull/draw module 304 into a seated/installed position within the respective slot 306 and cardguide 310. In the illustrated embodiment, modules 304b and 304c may be fully inserted within chassis 302, as indicated by lever 340 being disposed in the up position. In some embodiments, engagement of fastening devices may ensure that modules 304 are completely installed into chassis 302 (e.g., that rear connector 334 of module 304a has fully engaged a complementary backplane connector of chassis 302).

In some embodiments, modules 304 may be coupled to chassis 302 using a variety of fasteners. For example, in the illustrated embodiment, module 304a may be coupled to chassis 302 using a threaded fastener (e.g., a screw) 344 that extends through a top end of front panel 332. When installed, screw 344 is fastened to a complementary threaded hole in upper front rail 320 or other portion of chassis 302. In some embodiments, a module 304 may be coupled to chassis 302 using a combination of techniques. For example, module 304a may be coupled to lower front rail 318 via fastening device 336, and may be also fastened to upper front rail 320 via screw 344. Other embodiments may include any combination of fasteners. For example, modules 304 may be coupled to chassis 302 using any combination of screws at top and/or bottom ends of a front panel, fastening devices at the top and/or bottom ends of modules 304, or the like.

As described in more detail below, in some embodiments, one or more cardguides may include a support for the retention of an instrument within a chassis. For example, one or more of cardguides 310 disposed at lower or upper extremities of slots 303 may include a clip or similar feature that is capable of holding a thermistor, or similar temperature sensing device, in a position relative to cardguide 310. Such an implementation may enable disposing a thermistor at or near card guides, thereby enabling an internal temperature measurement of the chassis 302 to be taken at or near the cardguides.

Figure 3A:
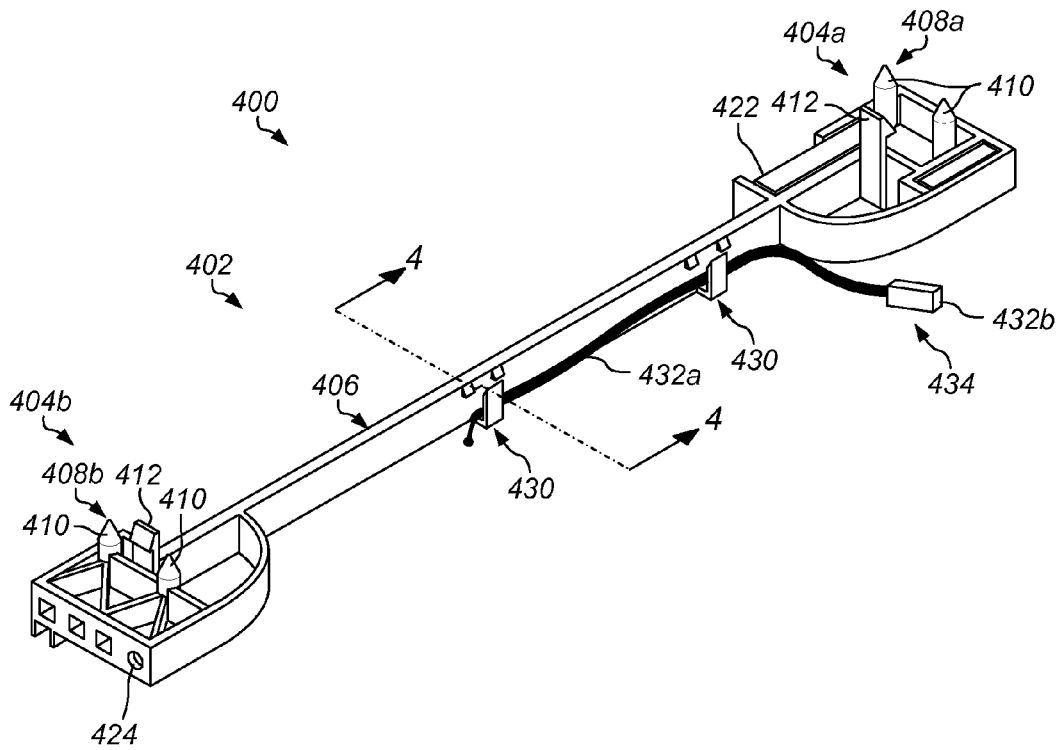
FIG. 3A is a diagram that illustrates a bottom-isometric view of a cardguide in accordance with one or more embodiments of the present technique.
Figure 3B:
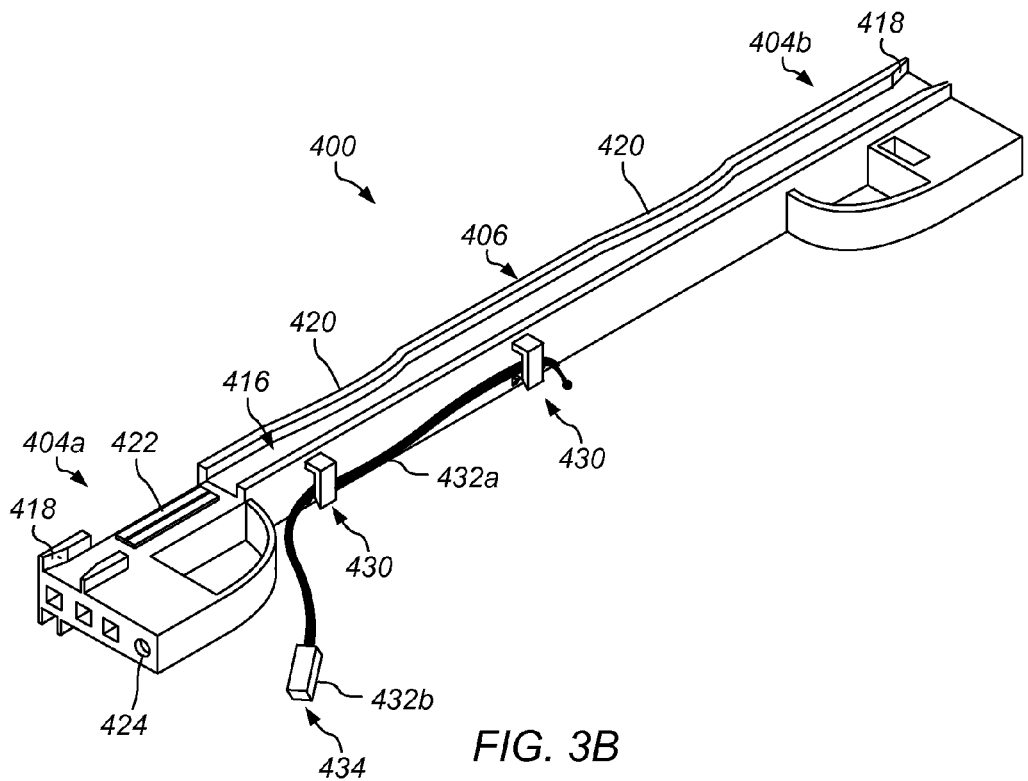
FIG. 3B is a diagram that illustrates a top-isometric view of the cardguide of FIG. 3A in accordance with one or more embodiments of the present technique.

FIGS. 3A and 3B are diagrams that illustrate bottom and top isometric views, respectively, of a cardguide 400 in accordance with one or more embodiments of the present technique. Cardguide 400 may be similar to that of cardguides 310 discussed above. For example, cardguide 400 may be disposed at ends (e.g., top and/or bottom) of slots 303 of chassis 302 to facilitate the installation of modular computer device 304 within chassis 302.

In some embodiments, cardguide 400 includes a body that couples to chassis 302. In the illustrated embodiment, for example, card guide 400 includes a rigid cardguide body 402 having a first end 404a, a second end 404b, and an elongated member (e.g., central member) 406 extending there between. In some embodiments, first and second ends 404a and 404b may provide for coupling of cardguide 400 to a chassis. For example, in the illustrated embodiment, each of first and second ends 404a and 404b include couplers 408a and 408b, respectively. Couplers 408a may enable cardguide 400 to be snapped into or other wise secured to chassis 302. In some embodiments, couplers 408a and/or 408b may include posts 410 and/or a clip 412 that may align with and/or couple to a complementary portion of chassis 302. For example, posts 410 may be inserted into alignment holes provided in a chassis 302 and clip 412 may snap into a corresponding slot and/or clip to an edge, lip, rail or similar feature of chassis 302.

In some embodiments, cardguide 400 may include a slot or track that facilitates installation and/or retention of devices, such as modules 304, within the chassis 300. For example, in the illustrated embodiment cardguide 400 includes a track (e.g., slot) 416 that extends along a length of cardguide 400. Slot 416 may include an elongated recess that is engaged by a complementary edge of a printed circuit board (PCB) of a module (e.g., upper or lower edge of PCB 312 of modules 304a). In some embodiments, slot 416 may extend across the entire length of cardguide 400. For example, slot 416 may include an elongated recess that extends across first and second ends 404a and 404b as well as central elongated member 406, as depicted. In some embodiments, slot 416 may include flared ends to facilitate capture and alignment of a device. For example, slot 416 may include flared ends 418 that provide for the alignment of an edge of a device (e.g., upper or lower edge of PCB 312 of modules 304a) as it is initially slid into slot 416. In some embodiments, slot 416 may include a biasing member that helps to retain the device within slot 416. For example, slot 416 may include biasing members 420 that extend into slot 416 such that a width of slot 416 at members 420 is less than a width of the instrument. In some embodiments, biasing members 420 may include an integral portion of sidewalls of slot 416 that can flex to accommodate a wide edge being disposed in slot 416. When the instrument is installed in slot 416, for example, biasing members 420 may press against an edge of instrument, thereby providing a friction/interference fit that acts to retain the instrument with slot 416.

In some embodiments, slot 416 may include a grounding terminal that engages a complementary grounding contact located at or near an edge of a PCB of an inserted one of modules 304. For example, in the illustrated embodiment cardguide 400 includes a grounding terminal 422. In some embodiments, grounding terminal 422 may include a conductive (e.g., metal) member that contacts a bottom or top edge of a device (e.g., module 304a) as it is slid into slot 416. Grounding terminal 422 may be electrically coupled to a ground location (e.g., enclosure 306 of chassis 302) and may, thus facilitate dissipation of charges from modules during insertion. For example, grounding terminal 422 may be located toward a first end 404a of cardguide 400 such that grounding terminal 422 is engaged by a complementary grounding connector disposed at an edge of a module 304a as module 304a is slid into slot 416. Engagement of grounding terminal 422 may facilitate the grounding of module 304a occurring prior to full/complete insertion of module 304a into slot 416 of cardguide 400 and, thus, prior to full/complete insertion of module 304a into slot 306 (e.g., prior to a connector 334 of module 304a coupling to a complementary backplane connector of chassis 302).

In some embodiments, cardguide 400 may include one or more alignment holes that are engaged by a complementary pin/protrusion of a module to facilitate alignment of a module within a respective slot. For example, in the illustrated embodiment, cardguide 400 includes alignment holes 424. In some embodiments, alignment pin/protrusion 338 of module 304a may engage alignment hole 424 as module 304a is slid into slot 416.

In some embodiments, when cardguide 400 is installed in chassis 300, first end 404a may be disposed at or near a front of chassis 300 such that modules may be slid into a slot of card guide 310 via first end 404a. Thus, for example, an edge of PCB 330 of module 304a may be aligned with flange 418 at first end 404a and module 304a may be advanced into slot 306. As module 304a is advanced, the edge of PCB 330 may engage and be retained by biasing members 420 and an electrical contact of PCB 330 may engage grounding terminal 422.

In some embodiments, cardguide 400 may include one or more supports that facilitate positioning of an instrument, such as a thermistor, at or near the location of cardguide 400. For example, in the illustrated embodiment, cardguide 400 includes two instrument supports (e.g., instrument clips) 430 disposed on central member 406. In some embodiments, instrument clips 430 may enable a user to simply snap an instrument into place without the use of additional tools or components. For example, in the illustrated embodiment, clips 430 enable a wire 432a of a thermistor 432 to be snapped into clip 430 and retained proximate cardguide 400 by clip 430. In some embodiments, providing a temperature measurement device, such as thermistor 432, at or near cardguide 400 may enable temperature measurements to be taken within chassis 300 at or near at top or bottom edge of a module. For example, cardguide 400 may be used for one or both of top and bottom cardguides 310 of a slot 303 of chassis 302, thereby enabling a thermistor to be positioned at one or both of a top or bottom of slot 303 of chassis 302.

Figures 4A, 6A:
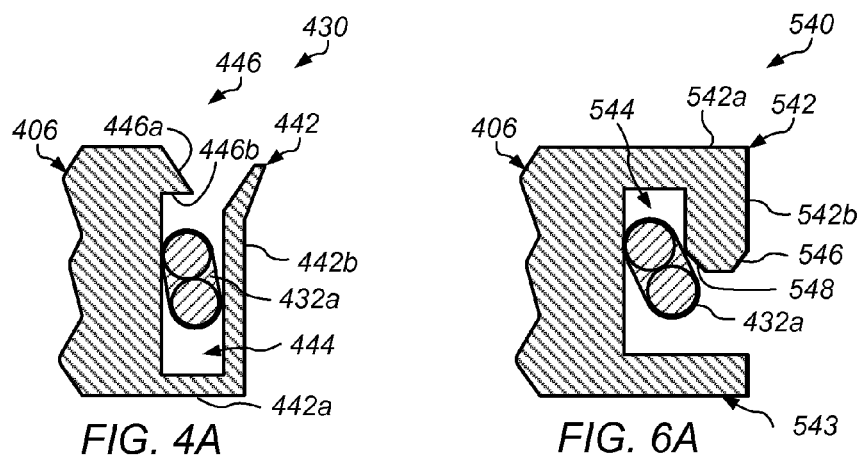
FIGS. 4A and 4B are cross-sectioned views of the cardguide taken across line 4-4 of FIG. 3A in accordance with one or more embodiments of the present technique.
FIGS. 6A and 6B are cross-sectioned views of the cardguide of FIG. 5 taken across line 6-6 in accordance with one or more embodiments of the present technique.
Figures 4B, 6B:
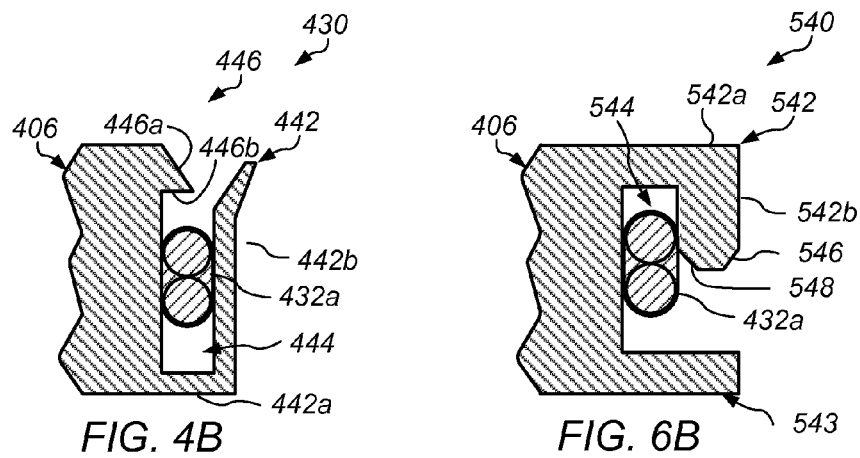

FIGS. 4A and 4B are cross-sectioned views of the cardguide of FIG. 3A taken across line 4-4 of FIG. 3A in accordance with one or more embodiments of the present technique. In the illustrated embodiments of FIGS. 4A and 4B, clip 440 includes a hook member 442. In some embodiments, hook member 442 includes an L-shaped member that extends from an exterior surface of central member 406. For example, in the illustrated embodiments, hook member 442 includes a first member 442a directly coupled to central member 406, and a second member 442b extending from and substantially perpendicular to first member 442a. Second member 442b may include a flanged/angled upper end, as depicted, to facilitate insertion of an instrument. Hook member 442 may define a cavity 444 in which a portion of thermistor 432 (e.g., thermistor wire 432a), or other instrument may be disposed during use. In some embodiments, cavity 444 may have a width less than a width of thermistor wire 432a such that thermistor wire 432a may be retained in cavity 444 at least partially due to a friction/interference fit between walls of cavity 444 and thermistor wire 432a as illustrated in FIG. 4B.

In some embodiments, clip 430 may include a portion that facilitates retention of an instrument within cavity 444. For example, in the illustrated embodiments, clip 430 includes a retention member 446 that includes a protrusion that extends over cavity 444 to at least partially inhibit removal the instrument (e.g., thermistor wire 432) from cavity 444. Retention member 446 may include a ramped outer portion 446a to facilitate insertion of the instrument into cavity 444 and/or a flat inner portion 446b to facilitate retention of instrument within cavity 444. In some embodiments, any number of retention members may be provided. For example, in the illustrated embodiments, retention members 446a are provided on each side of hook member 442 (see FIGS. 3A and 3B). In some embodiments, one or more retention member 446a may be provided aligned with hook member 442 (e.g., between the depicted retention members 446 of FIGS. 3A and 3B).

During use, thermistor wire 432a may simply be pressed into cavity 444 and be retained within cavity 444 by friction/interference and/or retention member 446 as illustrated in FIG. 4B. Thermistor wire 432a, and thus thermistor 432, may be installed into clip(s) 430 prior to or after installation of cardguide 400 within in chassis 302. In some embodiments, a thermistor connector 432b of thermistor 432 may be coupled to a complementary connector of a measurement device. For example, connector 432b may be coupled to a device within chassis 300 that detects internal chassis temperatures via thermistor 432.

Figure 5:
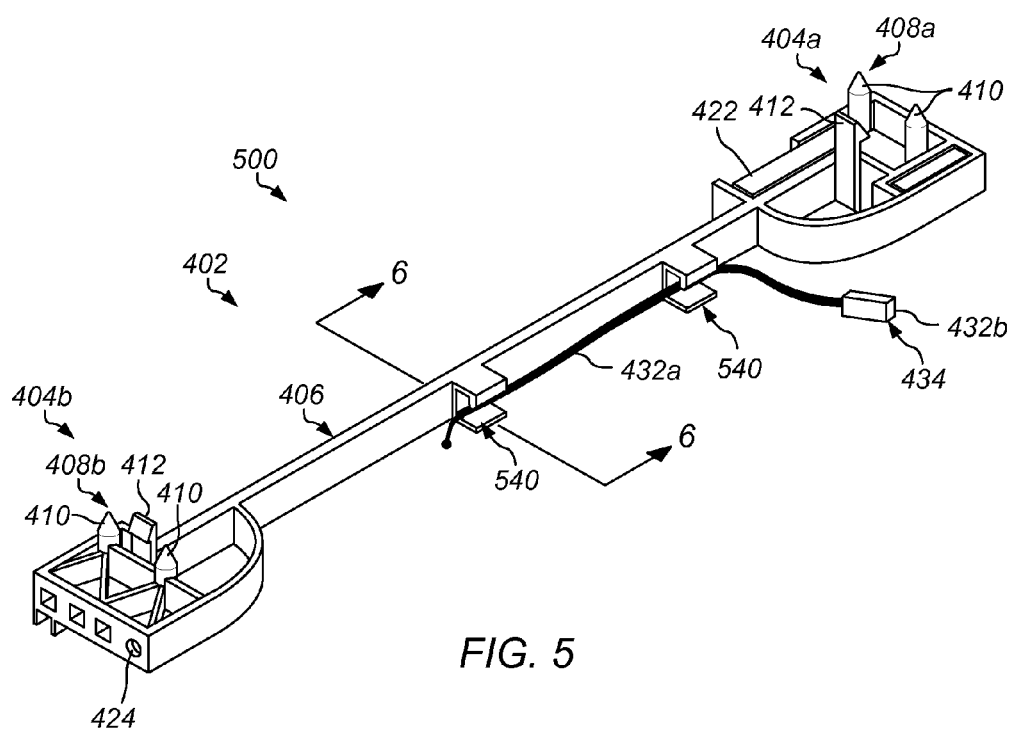
FIG. 5 is a diagram that illustrates an isometric view of a cardguide in accordance with one or more embodiments of the present technique.

FIG. 5 is a diagram that illustrates an isometric view of a cardguide 500 in accordance with one or more embodiments of the present technique. Cardguide 500 may include components similar to those of cardguide 400 described above. In some embodiments cardguide 500 may include clips 540 having an alternate configuration to that disclosed with respect to FIGS. 3A, 3B and 4. Clips 540 may include a C-shaped configuration that extends from central member 406. FIGS. 6A and 6B are is a cross-sectioned views of the cardguide of FIG. 5 taken across line 6-6 in accordance with one or more embodiments of the present technique. In the illustrated embodiments of FIGS. 6A and 6B, clip 540 includes a hook member 542 and a lower member 543. In some embodiments, hook member 542 includes an L-shaped member that extends from an exterior surface of central member 406. For example, in the illustrated embodiments, hook member 542 includes a first member 542a directly coupled to central member 406, and a second member 542b extending from and substantially perpendicular to first member 442a. Lower member 543 may include a substantially straight member that extends from an exterior surface of central member 406. In some embodiments, lower member 543 may include a hook shaped member similar to that of hook member 542. Hook member 542 and lower member 543 may define a cavity 544 in which a portion of thermistor 432 (e.g., thermistor wire 432a), or other instrument may be disposed during use. In some embodiments, cavity 544 may have a width less than a width of thermistor wire 432a such that thermistor wire 432a may be retained in cavity 544 at least partially due to a friction/interference fit between walls of cavity 544 and thermistor wire 432a as illustrated in FIG. 6B.

In some embodiments, clip 540 includes a portion that facilitates retention of an instrument within cavity 544. For example, in the illustrated embodiments, member 542b extends down in front of cavity 544 to at least partially block/inhibit removal the instrument (e.g., thermistor wire 432) from cavity 544. During use, thermistor wire 432a may simply be pressed into cavity 544 and be retained within cavity 544 via friction/interference and/or retention member 542b as illustrated in FIG. 6B. Thermistor wire 432a, and thus thermistor 432, may be installed into clip(s) 540 prior to or after installation of cardguide 500 within in chassis 300. In some embodiments, member 542b may include an outer portion 546 and/or inner portion 548 having a ramped surface 546 to facilitate insertion and/or removal of the instrument into and out of cavity 544. In some embodiments, inner portion 548 may be substantially flat to facilitate retention of instrument within cavity 544.

In some embodiments a clip may be formed as an integral portion of a card guide. For example, cardguide 400 may include clips 430 formed integrally therewith, and/or cardguide 500 may include clips 540 formed integrally therewith. In some embodiments, cardguides may be formed via a molding process. For example, cardguides 400 and 500 may be formed via injection molding having clips 430 and 540 formed integrally with central member 406 or another portion of cardguides 400 and 500.

In some embodiments, a clip may be coupled to a cardguide. For example, cardguide 400 and 500 may be formed without clips 430 and 540, and clips 430 and 540 maybe subsequently coupled to cardguides 400 and 500. In some embodiments, clips 430 and 540 may be coupled to cardguide via ultrasonic welding, use of a bonding agent (e.g., an adhesive), mechanical fasteners, or the like. Ultrasonic welding and/or use of a bonding agent may provide for clips 430 and 540 becoming an integral component of cardguide 400 or 500 although they were not initially formed as an integral component of cardguide 400 or 500 (e.g., clips 430 and 540 were not initially formed as an integral component of cardguide 400 or 500 via the molding process).

In some embodiments, any number and combination of clip types may be used. For example, a cardguide may include any combination of one or more of clips 430 and 540. In some embodiments, clips may be oriented in various directions. For example, one or more of clips 430 and 540 may be inverted. In some embodiments, for instance, one of clips 430 may open upward whereas the other of clips 430 may open downward).

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include", and derivations thereof, mean "including, but not limited to". As used in this specification, the singular forms "a", "an" and "the" include plural referents unless the content clearly indicates otherwise. Thus, for example, reference to "a device" includes a combination of two or more devices. The term "coupled" means "directly or indirectly connected".

We claim:

1. A cardguide, comprising:
a cardguide body configured to be disposed in a slot of a computer chassis during use, wherein the slot is configured to house a modular computer device during use;
a track configured to accept an edge of a printed circuit board of the modular computer device configured to be disposed in the slot of the computer chassis during use; and
a clip coupled to a central member, wherein the clip is configured to retain at least a portion of a temperature sensing device during use, wherein the clip provides for positioning the temperature sensing device proximate the slot of the computer chassis during use, and wherein the clip comprises:
a cavity, wherein the cavity is configured to have a width less than at least a portion of the temperature sensing device retained during use thereby at least partially inhibiting removal of the temperature sensing device from the cavity during use via a friction fit; and
a retention member, wherein the retention member is configured to at least partially inhibit removal of the temperature sensing device from the cavity during use, and wherein the retention member comprises a ramped outer portion, wherein the ramped outer portion facilitates insertion into the cavity of at least a portion of the temperature sensing device retained during use.

2. The cardguide of claim 1, wherein the clip is formed integrally with the central member of the cardguide body.

3. The cardguide of claim 1, wherein the clip comprises an L-shaped member defining the cavity configured to receive the temperature sensing device during use.

4. The cardguide of claim 3, wherein the retention member extends from the central member.

5. The cardguide of claim 1, wherein the clip comprises a C-shaped member defining the cavity configured to receive the temperature sensing device during use.

6. The cardguide of claim 5, wherein the retention member extends from a portion of the C-shaped member.

7. The cardguide of claim 1, wherein the temperature sensing device comprises a thermistor.

8. The cardguide of claim 1, wherein the cardguide comprises a PXI cardguide configured to be disposed in a PXI chassis.

9. The cardguide of claim 1, wherein the cardguide comprises the clip proximate a center of the central member of the cardguide body and another clip disposed proximate one of a first or a second end of the cardguide.

10. A method, comprising:
coupling to a computer chassis, a cardguide comprising:
a cardguide body configured to be disposed in a slot of the computer chassis during use, wherein the slot is configured to house a modular computer device during use;
a track configured to accept an edge of a printed circuit board of the modular computer device configured to be disposed in the slot of the computer chassis during use; and
a clip coupled to a central member, wherein the clip is configured to retain at least a portion of a temperature sensing device during use, wherein the clip provides for positioning the temperature sensing device proximate the slot of the computer chassis during use, and wherein the clip comprises:
a cavity, wherein the cavity is configured to have a width less than at least a portion of the temperature sensing device retained during use thereby at least partially inhibiting removal of the temperature sensing device from the cavity during use via a friction fit; and
a retention member, wherein the retention member is configured to at least partially inhibit removal of the temperature sensing device from the cavity during use, and wherein the retention member comprises a ramped outer portion, wherein the ramped outer portion facilitates insertion into the cavity of at least a portion of the temperature sensing device retained during use; and
disposing the temperature sensing device in the clip, wherein the temperature sensing device is configured to detect an internal temperature of the computer chassis proximate the slot of the computer chassis during use.

11. The method of claim 10, wherein the clip is formed integrally with the cardguide body.

12. The method of claim 10, wherein the clip comprises an L-shaped member defining the cavity configured to receive the temperature sensing device during use.

13. The method of claim 12, wherein the retention member extends from the central member.

14. The method of claim 10, wherein the clip comprises a C-shaped member defining the cavity configured to receive the temperature sensing device during use.

15. The method of claim 14, wherein the retention member extends from a portion of the C-shaped member.

16. The method of claim 10, wherein the temperature sensing device comprises a thermistor.

17. The method of claim 10, wherein the cardguide comprises a PXI cardguide and configured to be disposed in a PXI computer chassis.

18. The method of claim 10, wherein the cardguide comprises the clip proximate a center of the central member of the cardguide body and another clip disposed proximate one of a first or a second end of the cardguide.

19. A system, comprising:
a cardguide configured to be disposed in a computer chassis during use, wherein the cardguide comprises:
a track configured to accept an edge of a printed circuit board of a modular computer device configured to be disposed in the track during use; and
an integral clip configured to retain at least a portion of a temperature sensing device during use, wherein the integral clip provides for positioning the temperature sensing device within the computer chassis during use, and wherein the clip comprises:
a cavity, wherein the cavity is configured to have a width less than at least a portion of the temperature sensing device retained during use thereby at least partially inhibiting removal of the temperature sensing device from the cavity during use via a friction fit; and
a retention member, wherein the retention member is configured to at least partially inhibit removal of the temperature sensing device from the cavity during use, and wherein the retention member comprises a ramped outer portion, wherein the ramped outer portion facilitates insertion into the cavity of at least a portion of the temperature sensing device retained during use.

20. The system of claim 19, wherein a wire of the temperature sensing device is disposed in the integral clip such that that temperature sensing device is retained in a position proximate to the cardguide.

\* \* \* \* \*